United States Patent
Dura et al.

(10) Patent No.: US 7,855,671 B2
(45) Date of Patent: *Dec. 21, 2010

(54) PIPELINED ANALOG-TO-DIGITAL CONVERTER HAVING A POWER OPTIMIZED PROGRAMMABLE DATA RATE

(75) Inventors: Renaud Dura, Alx en Provence (FR); Caroline Tarnand, Alx en Provence (FR)

(73) Assignee: Atmel Corporation, San Jose, CA (US)

( * ) Notice: Subject to any disclaimer, the term of this patent is extended or adjusted under 35 U.S.C. 154(b) by 182 days.

This patent is subject to a terminal disclaimer.

(21) Appl. No.: 12/132,505

(22) Filed: Jun. 3, 2008

(65) Prior Publication Data

US 2008/0238753 A1    Oct. 2, 2008

Related U.S. Application Data

(63) Continuation of application No. 11/538,229, filed on Oct. 3, 2006, now Pat. No. 7,382,307.

(51) Int. Cl.
*H03M 1/12* (2006.01)

(52) U.S. Cl. .................................. 341/155; 341/161
(58) Field of Classification Search ................ 341/155, 341/161, 162, 163
See application file for complete search history.

(56) References Cited

U.S. PATENT DOCUMENTS

| | | | |
|---|---|---|---|
| 5,432,474 A | 7/1995 | Lauffenburger et al. | |
| 5,828,329 A | 10/1998 | Burns | |
| 5,877,720 A | 3/1999 | Setty et al. | |
| 5,990,820 A * | 11/1999 | Tan | 341/161 |
| 6,340,944 B1 | 1/2002 | Chang et al. | |
| 6,362,688 B1 | 3/2002 | Au | |
| 6,462,695 B1 | 10/2002 | Ahuja et al. | |
| 6,486,820 B1 | 11/2002 | Allworth et al. | |
| 6,489,904 B1 | 12/2002 | Hisano | |
| 6,501,411 B2 * | 12/2002 | Soundarapandian et al. | 341/161 |
| 6,570,523 B1 | 5/2003 | Bacrania et al. | |

(Continued)

FOREIGN PATENT DOCUMENTS

WO    WO 06034311 A2    3/2006

(Continued)

OTHER PUBLICATIONS

Chaloenlarp, et al., "Low Voltage Pipelined ADC Using Class-AB Pseudo-Differential OTA", (Oct. 26-29, 2004).

(Continued)

*Primary Examiner*—Brian Young
(74) *Attorney, Agent, or Firm*—Schwegman, Lundberg & Woessner, P.A.

(57) ABSTRACT

The present invention is related to a pipelined analog-to-digital converter (ADC) utilizing a power distribution scheme selectively delivering both constant and variable reference currents in selected proportions to a plurality of stages and operational transconductive amplifiers (OTAs). This permits the ADC to maintain an optimized speed over power consumption ratio over a wide data rate range. Since the invention is capable of supporting a large operating range while maintaining very low power consumption relative to the data rate, the pipelined ADC in accordance with the present invention is particularly adaptable to a large number of applications.

32 Claims, 6 Drawing Sheets

U.S. PATENT DOCUMENTS

| | | | |
|---|---|---|---|
| 6,608,504 | B2 | 8/2003 | Fujimoto |
| 6,686,860 | B2 | 2/2004 | Gulati et al. |
| 6,791,484 | B1 | 9/2004 | Lee et al. |
| 6,980,148 | B1 | 12/2005 | Bahai |
| 6,987,471 | B1 | 1/2006 | Murden et al. |
| 7,002,501 | B2 | 2/2006 | Gulati et al. |
| 7,068,202 | B2 | 6/2006 | Waltari |
| 7,071,778 | B2 | 7/2006 | Butler |
| 7,382,307 | B2 | 6/2008 | Dura et al. |
| 2004/0046684 | A1 | 3/2004 | Cusinato |
| 2004/0125008 | A1 | 7/2004 | Yamaji |

FOREIGN PATENT DOCUMENTS

| | | | |
|---|---|---|---|
| WO | WO-2008/042339 | A2 | 4/2008 |

OTHER PUBLICATIONS

Mak, et al., "An I/Q-Multiplexed and OTA-Shared CMOS Pipelined ADC with an A-DQS S/H Front-End for Two Step Channel Select Low-If Receiver", (May 23-26, 2004).

"U.S. Appl. No. 11/538,229, Non-Final Office Action mailed Sep. 14, 2007", 6 pgs.

"U.S. Appl. No. 11/538,229, Notice of Allowance mailed Jan. 28, 2008", 4 pgs.

"U.S. Appl. No. 11/538,229, Preliminary Amendment filed Jul. 31, 2007", 8 pgs.

"U.S. Appl. No. 11/538,229, Reply filed Dec. 17, 2007 to Non-Final Office Action mailed Sep. 14, 2007", 10 pgs.

"International Application Serial No. PCT/US2007/021097, International Search Report mailed Apr. 21, 2008", 2 pgs.

"International Application Serial No. PCT/US2007/021097, Written Opinion mailed Apr. 21, 2008", 5 pgs.

* cited by examiner

PIPELINED ANALOG-TO-DIGITAL CONVERTER HAVING A POWER OPTIMIZED PROGRAMMABLE DATA RATE

This application is a Continuation of U.S. application Ser. No. 11/538,229, filed on Oct. 3, 2006 now U.S. Pat. No. 7,382,307, which is incorporated herein by reference.

FIELD OF INVENTION

The present invention is related to analog-to-digital converters (ADCs). More particularly, the present invention is directed to an ADC having a pipelined architecture with an improved power distribution scheme for data rate programmability.

BACKGROUND

An ADC is an electronic circuit that converts a continuous analog signal, such as a voltage signal, to a discrete digital number. Due to the popularity of consumer electronic devices, there are a large number of applications that employ ADCs with medium resolution, such as 10 bits, and medium to high data rates ranging from a few MHz to several tens of MHz. Among these applications are wireless communication systems, mobile phones, video components, imaging components, local area network transceivers, and the like.

Pipelined ADCs have multiple stages which successively process an analog input signal. The principal in pipelined ADCs is to find a set of reference voltages whose sum equals the signal sample being converted. This is realized by subtracting different reference voltages from the input sample until the residue value becomes zero, indicating that the sum of the subtracted references equals the original signal sample. In the pipeline, the analog residue or remainder value may be amplified by an amplifier between the subtraction steps in order to increase accuracy prior to being fed to the next stage in the pipeline.

Figure 1:
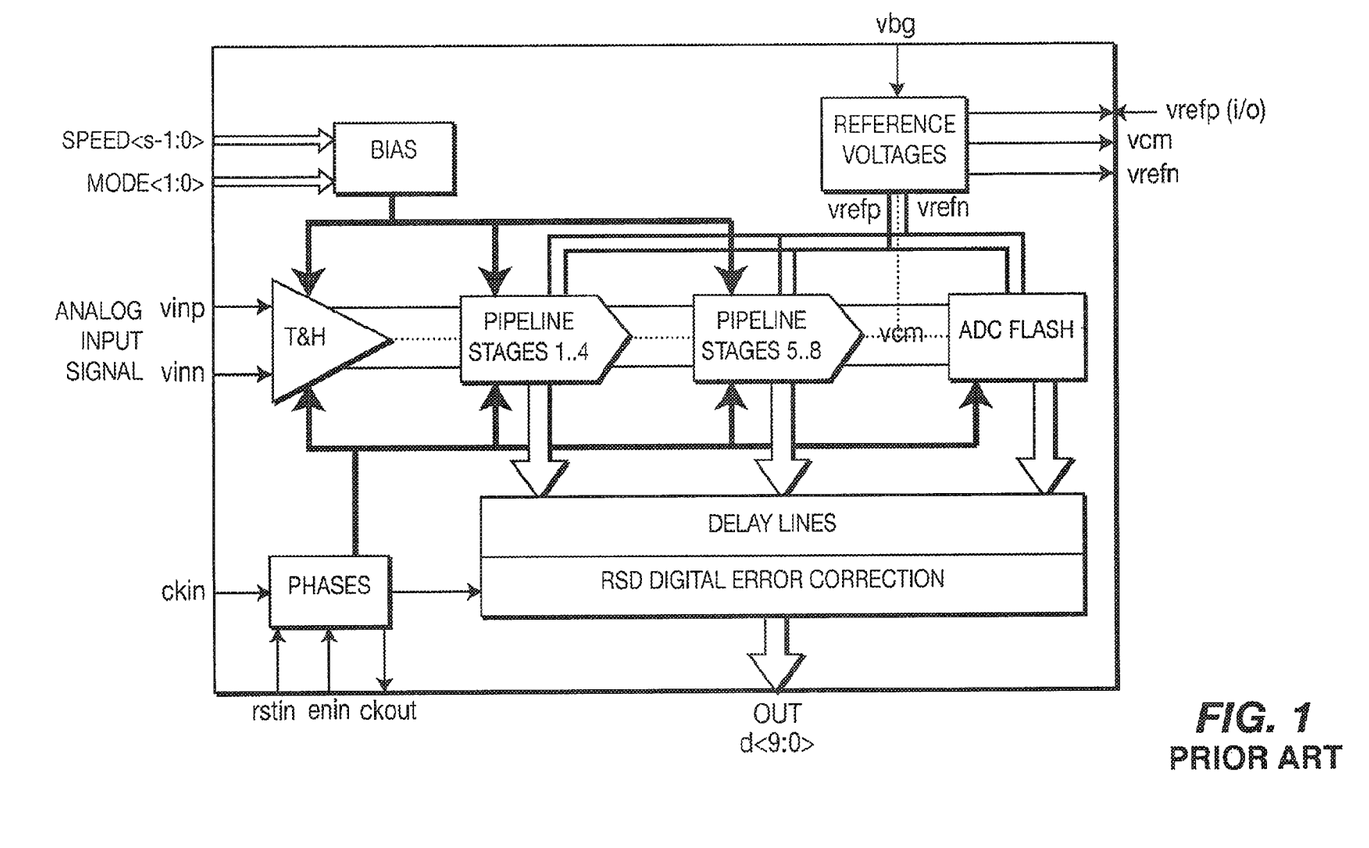
FIG. 1 is a block diagram of a conventional pipelined ADC.

FIG. 1 is a high-level block diagram of a conventional 10-bit pipelined ADC. There are two basic types of components within the ADC: 1) pure analog components which include a reference voltage generator, a bias current generator, a track and hold (T&H) stage, front end pipeline stages (1 through 4) and back end pipeline stages (5 through 8); and 2) digital and mixed analog/digital components including a phases generator, a 2 bit ADC flash unit, delay lines, and a Redundant Signed Digital (RSD) error correction unit.

In the pipelined architecture shown in FIG. 1, the ADC has nine stages which process the analog input signal. However, the number of stages in a pipelined architecture can be any number depending on the desired resolution of the ADC. The greater the number of stages in an ADC the higher the resolution. From the left side of FIG. 1, the analog input signal first enters the (T&H) stage. Subsequent pipeline stages 1 through 8 process the T&H output and drive a 2 bit ADC on the right. In each of the nine stages, an operational transconductive amplifier (OTA) is the active consuming analog cell. As an example, the ADC shown in FIG. 1 uses an external s-bits bus (speed<s−1:0>), where s may be any number, in order to program the ADC with a specific amount of active current that is proportional to the targeted data rate of the ADC.

Figure 2:
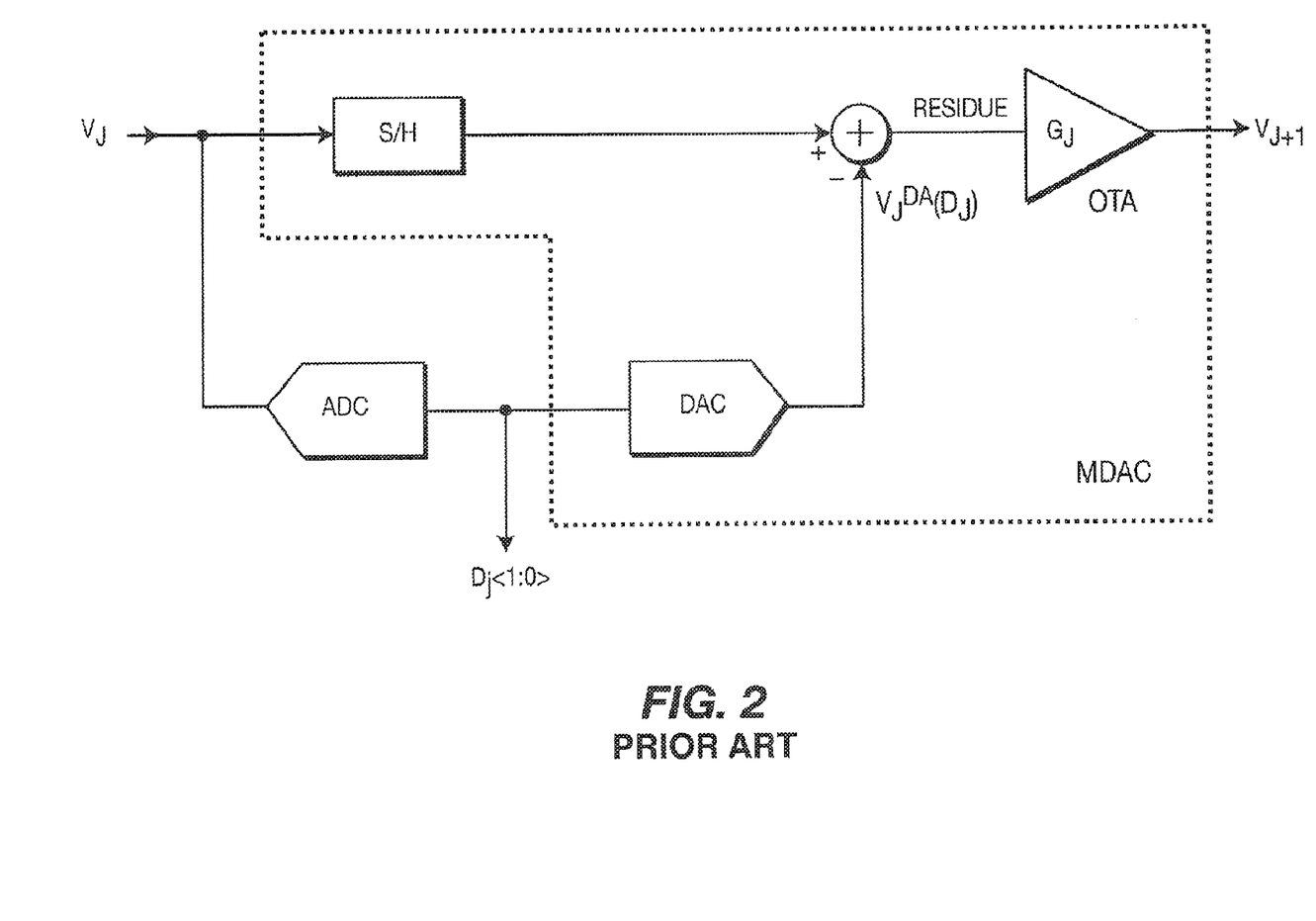
FIG. 2 is a block diagram of a conventional single pipeline stage.

Referring to FIG. 2, a block diagram of a single pipeline stage is shown. The single pipeline stage includes a sample and hold (S/H) unit for providing a constant analog signal, an ADC, a digital-to-analog converter (DAC), a summer and an OTA. The input $V_j$ is the sample number $j$ coming out from the previous pipeline stage as a new input to the present stage. It is sampled and held, and also quantized with a low resolution 2 bit ADC. The resulting digital word $D_j<1:0>$ is converted back to analog using a 2 bit DAC and subtracted from the original held value to create a residue. The residue is then amplified by $G_j$ to generate an output voltage $V_{j+1}$ to the next pipeline stage given by Equation (1) as follows:

$$V_{j+1} = G_j \cdot (V_j - V_j^{DA}(D_j)). \quad \text{Equation (1)}$$

When considering the switched capacitor implementation, the S/H function as well as the DAC, the voltage subtraction and the residue amplification may be performed by a single operation known by those skilled in the art as a multiplying DAC or MDAC. The MDAC performs the operation in a period that is set by half a clock period, due to the switched capacitor circuit implementation. During a first half clock period the sample value is stored in a first capacitor. During a second half clock period the sample value is amplified by an OTA and multiplied by a gain value.

Since the 2 bit ADC-DAC implementation has a very low resolution, it is designed to provide a very high speed response. A limiting element of the pipeline stage, in terms of speed, is the OTA, which performs and provides the $V_{j+1}$ output. Setting the gain $G_j$ with a high enough resolution not to degrade the final ADC converter resolution, results in high power consumption. Additionally, the overall speed of the OTA is directly dependent upon the power consumption. The more power that is provided to the OTA, the faster the speed of the OTA and the conversion data rate of the ADC device. However, the increased speed of the OTA results in higher power consumption of the ADC. This is a significant drawback, particularly for wireless devices and other consumer electronic devices which rely upon a battery as a power source.

Accordingly, what is needed is a versatile pipelined ADC which can operate at a desired resolution over a wide operating range without the drawback of high power consumption of current pipelined ADCs. Moreover, an ADC that is independent of circuit process variations for providing a reliable resolution is desirable.

SUMMARY

The present invention is related to a pipelined ADC utilizing a power distribution scheme selectively delivering both constant and variable reference currents in selected proportions to a plurality of stages and OTAs. This permits the ADC to maintain an optimized speed over power consumption ratio over a wide data rate range. Since the invention is capable of supporting a large operating range while maintaining very low power consumption relative to the data rate, the pipelined ADC in accordance with the present invention is particularly adaptable to a large number of applications.

BRIEF DESCRIPTION OF THE DRAWINGS

A more detailed understanding of the invention may be had from the following description, given by way of example and to be understood in conjunction with the accompanying drawings wherein.

DETAILED DESCRIPTION OF THE PREFERRED EMBODIMENTS

The present invention would be described with reference to the drawings wherein like numerals represent similar elements throughout. For purposes of describing the present invention, the phrase low, medium, or high voltage levels may be used. It will be appreciated that the words "low", "medium", and "high" are relative terms and not necessarily a fixed voltage. Accordingly, the phrase low, medium, or high voltage level may be any voltage and may vary, for example, based on the processing technology and/or the material in which an electronic device is implemented. The word "level" may represent a fixed voltage or a voltage range, as desired. Moreover, predetermined voltage levels in the description forthcoming can be any voltage level and may be dependent on the design, structure, and materials used to configure a circuit element. A node, a voltage at a node, or a current at a node may be used interchangeably and a load capacitance may be a parasitic capacitance in the description forthcoming. It should be understood by those of skill in the art that the equations and variables set forth below are exemplary and should not be understood to limit the invention.

Figure 3:
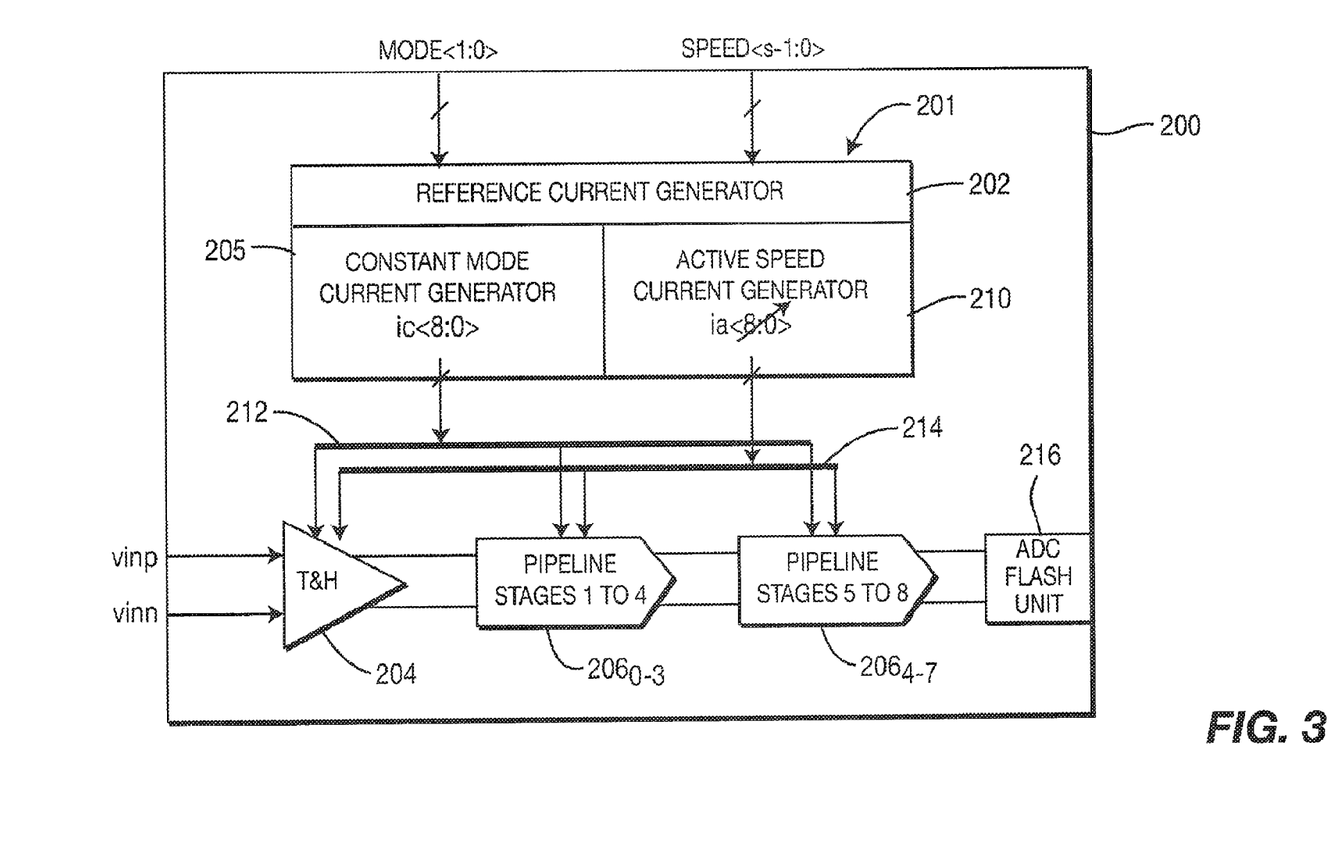
FIG. 3 is a block diagram of a pipelined ADC in accordance with the present invention.

A block diagram of a pipelined ADC in accordance with the present invention is shown in FIG. 3. The ADC 200 includes a bias current unit 201, a track and hold (T&H) unit 204, a plurality of pipeline stages including pipeline stages 1 through 4 $206_{0-3}$, pipeline stages 5 through 8 $206_{4-7}$, and a flash ADC unit 216. Although stages 1 through 4 and 5 through 8 are shown as separated into two distinct groups this is only for simplicity of explanation. Each stage may be provided with an independent reference current level by bias current unit 201, as will be explained in detail hereinafter, and an independent operating point. The ADC circuit 200 may also have any number of pipeline stages depending upon the desired resolution of the ADC circuit 200. It should be understood by those of skill in the art that pipelined ADCs may comprise many other components to support the various resolutions of the ADC circuit 200. However, for simplicity, only those portions of the pipelined ADC in accordance with the present invention are described in detail hereinafter.

The bias current unit 201 includes a reference current generator 202 which may be a proportional to the absolute temperature (PTAT) reference current generator, a constant mode current generator 205 and an active speed current generator 210. The reference current generator 202 generates and provides reference current, which is proportional to temperature in the case of a PTAT reference current, to the constant mode current generator 205 and the active speed current generator 210. A PTAT reference current generator 202 may be desirable in order to make the present invention insensitive to temperature effects. Considering a programmed ADC speed, the use of a PTAT reference current generator would maintain the desired OTA bandwidth constant over any temperature variations providing compliance for any desired operational temperature range for the present invention.

The constant mode current generator 205 generates constant mode bias current ic to the individual pipeline stages $206_{0-7}$. The active speed current generator 210 selectively generates variable or programmable bias current ia to the individual pipeline stages $206_{0-7}$. In general, the bias current unit 201 generates and distributes current to the T&H unit 204 and the individual pipeline stages $206_{0-7}$ via 2 separate channels; a first channel 212 for conducting constant mode current ic and a second channel 214 for conducting variable current ia.

The first channel 212 comprises a bus of nine lines; one line for each active component; (i.e. the T&H unit 204 and the pipeline stages $206_{0-7}$). Accordingly, constant mode current ic is distributed via one of the lines to the T&H unit 204 and the pipeline stages $206_{0-7}$. The constant mode current ic, generated by the constant mode current generator 205, is a fixed current which depends on the mode of operation of the ADC.

The second channel 214 comprises a bus of nine lines; one line for each active component. Accordingly, active speed current ia is distributed via one of the lines to the T&H unit 204 and the pipeline stages $206_{0-7}$. The active speed current ia may be used to provide increased flexibility and greater bandwidth to the T&H unit 204, as desired. The mode <1:0> input to bias current unit 201 may be used to selectively control the operation of the currents ic and ia.

The active speed current ia is proportional to the desired speed <s−1:0>, where s may be any number, which may offer $2^s$ codes of programmability. Although up to two bits of programmability is shown in FIG. 3, s may be any value used to provide higher desired levels of analog to digital resolution, as desired.

Still referring to FIG. 3, the T&H unit 204 samples an analog input signal, maintains that signal level for a predetermined duration, and passes the signal to the pipelined stages $206_{0-7}$ for sequential processing of the signal. The final pipeline stage transfers the last analog signal to the flash ADC unit 216 for quantization of the pipeline remaining residue. In accordance with the present invention, the bias current unit 201 selectively delivers constant mode and active speed current ic, ia, respectively, to each of the active components 204 and $206_{0-7}$. Since each stage may be selectively provided with a constant mode and an adaptive active speed currents ic, ia respectively, the pipelined ADC 200 can be programmed to provide any desired data rate while minimizing power requirements. Power is conserved since the use of an unnecessarily high active current may be prevented by independently adjusting the current level of each pipelined stage.

Figure 4:
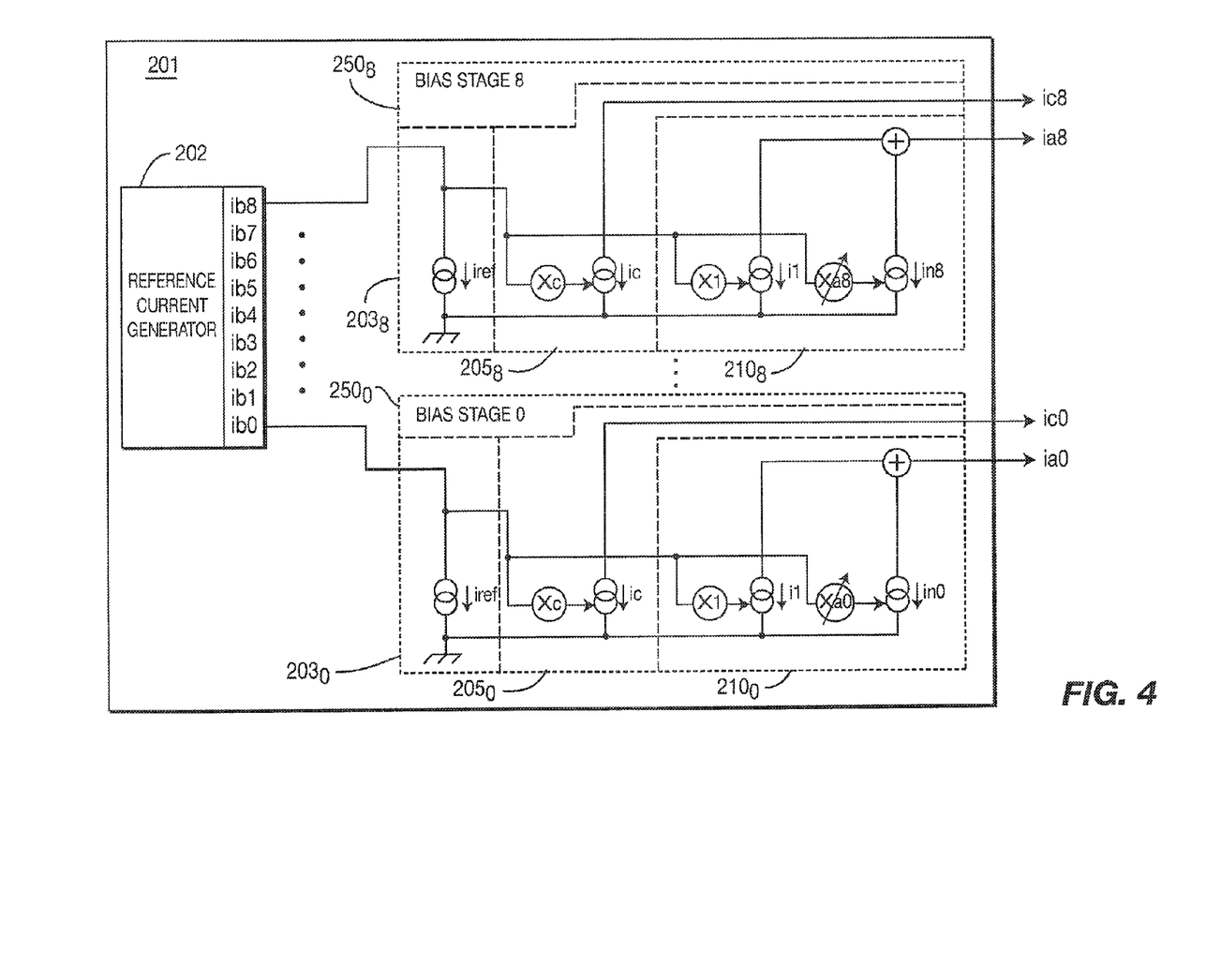
FIG. 4 is a block diagram of the current programming scheme per pipeline stage in accordance with the present invention.

Referring to FIG. 4, a schematic diagram of the bias current unit 201 which generates and selectively outputs current for each pipelined stage $206_{0-7}$ in accordance with the present invention is provided, The bias current unit 201 includes the reference current generator 202, which may be a PTAT reference current to compensate for any temperature effects, and a plurality of bias stages $250_{0-8}$; one for each pipelined stage $206_{0-7}$ and the T&H unit 204.

The constant mode current generators $205_{0-8}$ and the active speed current generators $210_{0-8}$ may comprise separate and distinct components as shown in FIG. 4. In FIG. 4, each current generator may comprise a portion of a bias stage 250. The reference current generator 202 distributes a reference current $ib_i$ [i=0 . . . 8] to each of the plurality bias stages $250_{0-8}$ that provide current to each pipelined stage $206_{0-7}$ and the T&H unit 204. Although nine bias stages are shown in FIG. 4, any number of bias stages may be used depending upon the desired number of pipelined stages. Each bias stage $250_{0-8}$ receives $ib_i$, which is used as a current reference iref as shown by $203_{0-8}$, and transmits both constant mode current $ic_i$ and active speed current $ia_i$ to its corresponding pipeline stage $206_{0-7}$ and T&H unit 204.

The transfer function of the local bias stage number i is given as follows:

$$ic_i = c \cdot iref; \quad \text{Equation (2)}$$

$$ia_i = (a_i+1) \cdot iref \quad \text{Equation (3)}$$

where iref is the reference current provided by unit 202, c is a constant integer dependent upon the desired OTA operating point, and $a_i$ is a programmable or variable number, such as an integer, dependent upon the desired variable program speed <s−1:0>. Since $a_i$ is a variable, the ADC can be used to provide an active current that is proportional to any desired data or conversion rate.

Table 1 provides purely as an example a case where s=2.

TABLE 1

| Programmed Speed | | | Current $ia_1$ |
|---|---|---|---|
| speed<1> | speed<0> | $a_1$ | (unit in iref) |
| 0 | 0 | 0 | 1 |
| 0 | 1 | 1 | 2 |
| 1 | 0 | 2 | 3 |
| 1 | 1 | 3 | 4 |

Since $a_i$ is a variable, each OTA in the pipeline ADC 200 may be programmed using any amount of current $ia_i$ as given in Equation (3) and shown in Table 1. Since the OTA in accordance with the present invention may be programmable, the OTA can provide a bandwidth large enough to be compatible with any desired ADC data rate.

Figure 5:
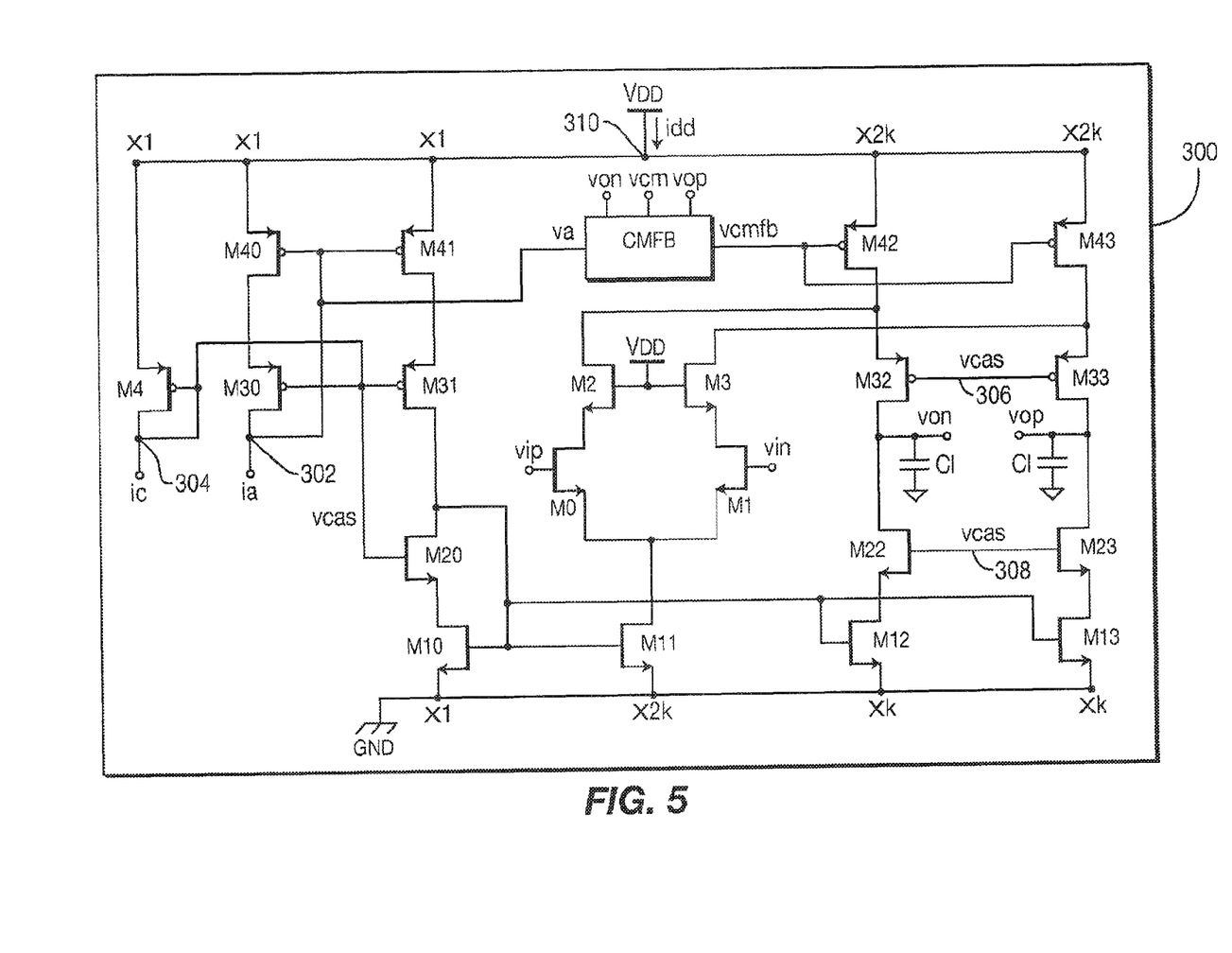
FIG. 5 is a schematic diagram of a fully differential folded cascode OTA in accordance with the present invention.

Each pipelined stage 206₀₋₇ in accordance with the present invention may be configured similar to the general configuration shown in FIG. 2. However, the present invention includes an OTA 300 which is adapted to take advantage of the two-part current distribution scheme shown in FIGS. 3 and 4 for adjusting the power consumption to any desired data rate. With the power consumption adapted to the desired ADC data rate, this data rate is considered as the maximum data rate (MDR) of the ADC. Referring to FIG. 5, a transistor level schematic of an OTA 300 in accordance with the present invention is shown. Although, there are a plurality of bias stages 250₀₋₈ in a pipelined ADC having a corresponding plurality of OTAs 300, only one OTA 300 is shown for simplicity.

The OTA 300 is a fully differential folded cascode topology using an n-type metal-oxide semiconductor (NMOS) transistor input pair. As those that are skilled in the art would realize, the p-type metal-oxide semiconductor (PMOS) type transistor input pair version could also be considered. The output of the OTA 300 may be loaded by single-ended load capacitors C1.

The Common Mode FeedBack box (CMFB) provides regulation of the common mode output voltage ensuring that either vop=von=vcm when vip=vin at the input of the OTA 300 or (vop+von)/2=vcm for all other cases. The two separate input currents, the active speed current ia at node 302 and the constant mode current ic at node 304 are received from a respective bias stage 250₀₋₈. The constant mode current ic is derived from Equation (2) and is used to set the internal cascode voltage nodes vcas 304, 306, and 308 in order to maximize the dynamic output range of the OTA 300. The active speed current ia is derived from Equation (3) and is used to provide a desirable unity gain bandwidth for OTA 300.

A metric used to measure the performance of circuits 200 and 300 is the ratio of the maximum data rate (MDR) to the power dissipation, sometimes referred to as the figure of merit (FOM) of an ADC device, given by Equation (4) as follows:

$$FOM = \frac{MDR}{POWER}. \quad \text{Equation (4)}$$

The MDR of ADC 200 is given by Equation (5) as follows:

$$MDR \approx A \cdot \frac{k*(a_i+1) \cdot iref}{Cl}. \quad \text{Equation (5)}$$

In Equation (5), A is a fixed parameter dependent upon a desired processing technology and the desired resolution (i.e. number of bits) of an ADC, and k is the current amplification factor of OTA 300. Therefore, MDR is directly proportional to the current amplification factor k, the reference current iref, and the local active current variable $a_i$ for each stage as set forth in Equation (3) and shown in FIG. 4. MDR is inversely proportional to the equivalent capacitance, including any parasitic capacitances, Cl seen at the output of circuit 300.

In Equation (4), the dissipated POWER metric is calculated by summing the current consumed by each pipeline stage 206₀₋₇ and T&H unit 204. Since each pipeline stage 206₀₋₇ and T&H unit 204 may include an OTA similar to 300, the total dissipated POWER is given by Equation (6) as follows:

$$POWER = 1000*P*idd*V_{DD} \text{ (in mW)}. \quad \text{Equation (6)}$$

In Equation (6), P is the total number of OTA circuits 300 used in ADC 200, $V_{DD}$ is the supply voltage level, and current idd is the supply current level at node 310 for each stage given by Equation (7) as follows:

$$idd = ic_i + (4k+2)*ia_i. \quad \text{Equation (7)}$$

In Equation (7), k is the current amplification factor of OTA 300, $ic_i$ is the constant mode current at node 304, and $ia_i$ is the active speed current at node 302.

Substituting Equations (2) and (3) into Equation (7) gives Equation (8) as follows:

$$idd = (c + 2(2k+1)(a_i+1))*iref. \quad \text{Equation (8)}$$

In Equation (8), the variables c, k, $a_i$, and iref are the same as those provided in Equations (2), (3) and (7) above. Since the supply current idd of each OTA stage 300 is dependent upon the programmable variable $a_i$, both the OTA unity gain bandwidth and power consumption may be optimized for OTA 300 and ADC 200, respectively.

Substituting Equations (5), (6), and (8) into Equation (4) and assuming 2(2k+1)>>c, the FOM may be given by Equation (9) as follows:

$$FOM \cong \frac{A \cdot k}{2000 \cdot P \cdot Vdd \cdot (2k+1) \cdot Cl} \quad \text{Equation (9)}$$

In Equation (9), c, $a_i$ and iref have been removed from the expression for the FOM. The ADC 200 has been made independent of the programmed data rate and corresponding current consumption which results in ADC 200 performing at a desirably optimized constant speed over power ratio.

Figure 6:
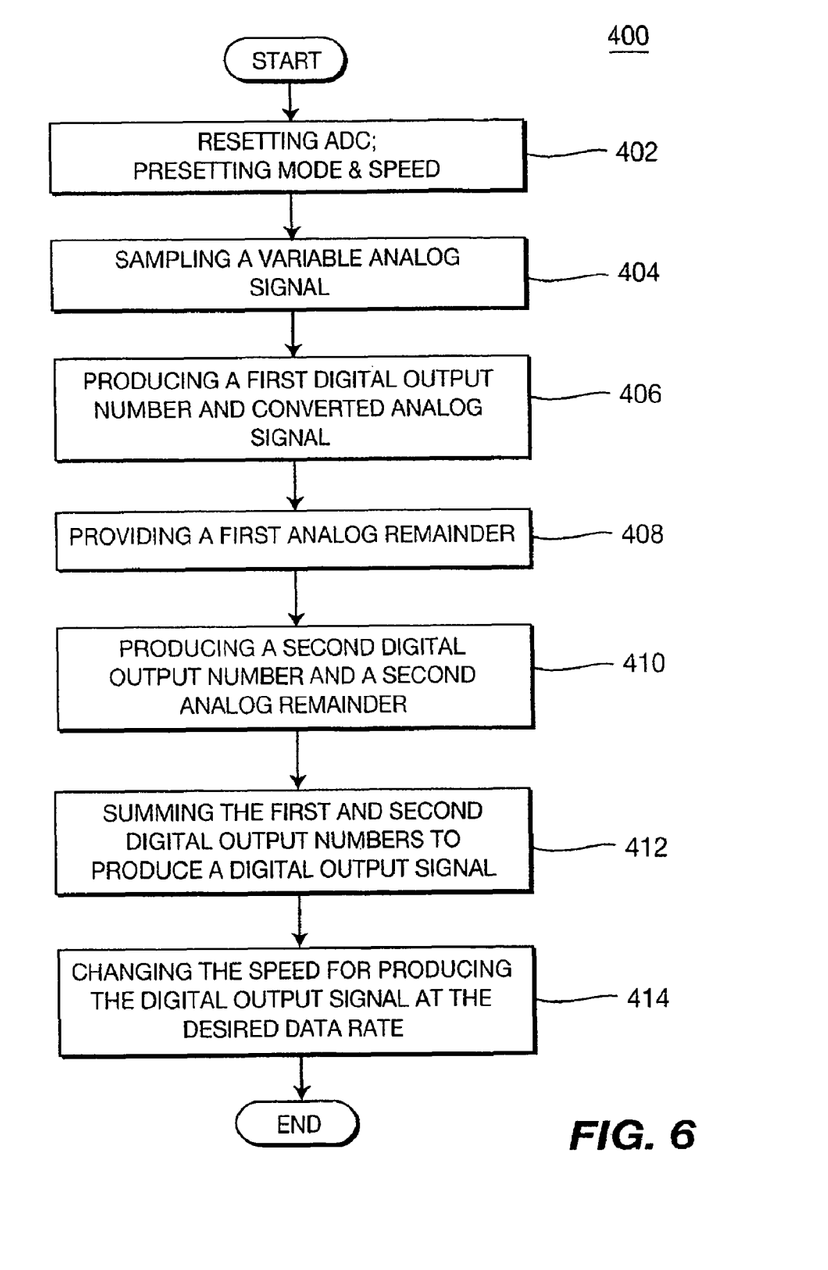
FIG. 6 is a process for providing analog to digital conversion having a selectable data rate in accordance with the present invention.

FIG. 6 is a process 400 for providing steps for analog to digital conversion having a selectable data rate and optimized power dissipation in accordance with the present invention. An ADC is RESET and the MODE and SPEED are preset to a default value providing a default bias current setting which includes a set of constant bias current and a set of (preset)

variable or active bias current (step 402). A variable analog signal level is sampled (step 404) to provide a constant analog signal. The constant analog signal level is provided to an analog to digital converter for producing a first digital output number which is then converted back to a converted analog signal via a digital to analog converter (step 406). A first analog remainder is provided by subtracting the second analog signal from the sampled analog signal level (step 408). The first analog remainder signal is used to produce a second digital output number and a second analog remainder (step 410). The first and second digital output numbers are summed to produce a digital output signal (step 412). Changing the SPEED programming to generate a new set of variable bias current, for producing the digital output signal to the desired data rate while dissipating a minimum amount of power (step 414) may then be performed.

Although the features and elements of the present invention are described in the preferred embodiments in particular combinations, each feature or element can be used alone without the other features and elements of the preferred embodiments or in various combinations with or without other features and elements of the present invention. The present invention may be implemented in a computer program or firmware tangibly embodied in a computer-readable storage medium having machine readable instructions for execution by a machine, a processor, and/or any general purpose computer for use with or by any non-volatile memory device. Suitable processors include, by way of example, both general and special purpose processors.

Typically, a processor will receive instructions and data from a read only memory (ROM), a RAM, and/or a storage device having stored software or firmware. Storage devices suitable for embodying computer program instructions and data include all forms of non-volatile memory, including by way of example semiconductor memory devices, read only memories (ROMs), magnetic media such as internal hard disks and removable disks, magneto-optical media, and optical media such as CD-ROM disks and digital versatile disks (DVDs). Types of hardware components, processors, or machines which may be used by or in conjunction with the present invention include Application Specific Integrated Circuits (ASICs), Field Programmable Gate Arrays (FPGAs), microprocessors, or any integrated circuit.

What is claimed is:

1. An analog to digital converter, comprising:
   an input unit to receive a variable analog input signal and to produce a constant analog signal;
   a first pipeline stage to receive the constant analog signal and to produce a first digital output number and a first analog remainder signal;
   at least one subsequent pipeline stage to receive the first analog remainder signal and to produce a second digital output number and a second analog remainder;
   a summing unit to sum the first and second digital output numbers to generate a digital output signal; and
   a bias current generation unit, comprising:
      a constant bias current generator, separately coupled to said input unit and each pipeline stage, to generate a constant current;
      a variable bias current generator, separately coupled to said input unit and each pipeline stage, to generate a variable current that is related to the selectable data rate; and
      and a reference current generator, coupled to the constant bias current generator and the variable bias current generator, for generating a reference current.

2. The converter of claim 1, wherein the first digital output number is delayed by one half of a clock period compared to said second digital output number.

3. The converter of claim 1, wherein the input unit further comprises a sampler for sampling the variable analog input signal to produce said constant analog signal.

4. The converter of claim 1, wherein said constant bias generator utilizes said reference current to generate said constant current.

5. The converter of claim 4, wherein said constant current is a fixed current dependent on the mode of operation for the Analog to Digital Converter.

6. The converter of claim 1, wherein said variable bias current generator utilizes said reference current to generate said variable current.

7. The converter of claim 1, wherein said variable bias current generator selectively generates said variable current for the first pipeline stage and the subsequent pipeline stage.

8. The converter of claim 1, wherein the reference current generator is to generate a reference current that is proportional to an absolute temperature (PTAT) reference current.

9. The converter of claim 1, wherein the bias current generation unit further comprises a plurality of bias stages, one bias stage coupled to said input unit and each pipeline stage.

10. The converter of claim 1, wherein the variable bias current generator generates a different variable current for each pipeline stage.

11. The converter of claim 1, wherein the variable bias current is proportional to a programmable variable.

12. The converter of claim 10, wherein the programmable variable is dependent upon a program speed variable.

13. The converter of claim 1, wherein the summing unit is a final pipeline stage that quantizes the remaining residue of the pipeline.

14. The converter of claim 13, wherein the quantized remaining residue of the pipeline is optimized for power by a figure of metric relationship.

15. An analog to digital converter, comprising:
   an input unit to receive a variable analog input signal and to produce a constant analog signal, the input unit including a sampler to sample the variable analog input signal to produce the constant analog signal;
   a first pipeline stage to receive the constant analog signal and to produce a first digital output number and a first analog remainder signal;
   at least one subsequent pipeline stage to receive the first analog remainder signal and to produce a second digital output number and a second analog remainder, wherein the first digital output number is delayed by one half of a clock period compared to said second digital output number;
   a summing unit to sum the first and second digital output numbers to generate a digital output signal; and
   a bias current generation unit, comprising:
      a constant bias current generator, separately coupled to said input unit and each pipeline stage, to generate a constant current;
      a variable bias current generator, separately coupled to said input unit and each pipeline stage, to generate a variable current that is related to the selectable data rate;
      and a reference current generator, coupled to the constant bias current generator and the variable bias current generator, for generating a reference current.

16. The converter of claim 15, wherein the reference current generator is to generate a reference current that is proportional to an absolute temperature (PTAT) reference current.

17. The converter of claim 15, wherein the bias current generation unit further comprises a plurality of bias stages, one bias stage coupled to said input unit and each pipeline stage.

18. The converter of claim 15, wherein the variable bias current generator generates a different variable current for each pipeline stage.

19. The converter of claim 15, wherein the variable bias current is proportional to a programmable variable.

20. The converter of claim 19, wherein the programmable variable is dependent upon a program speed variable.

21. The converter of claim 15, wherein said constant current is a fixed current dependent on the mode of operation for the Analog to Digital Converter.

22. The converter of claim 15, wherein the summing unit is a final pipeline stage that quantizes the remaining residue of the pipeline.

23. The converter of claim 22, wherein the quantized remaining residue of the pipeline is optimized for power by a figure of metric relationship.

24. An analog to digital converter, comprising:
   an input unit to receive a variable analog input signal and to produce a constant analog signal, the input unit including a sampler to sample the variable analog input signal to produce the constant analog signal;
   a first pipeline stage to receive the constant analog signal and to produce a first digital output number and a first analog remainder signal;
   a summing unit to sum the first and second digital output numbers to generate a digital output signal; and
   a bias current generation unit, comprising:
      a constant bias current generator, separately coupled to said input unit and each pipeline stage, to generate a constant current;
      a variable bias current generator, separately coupled to said input unit and each pipeline stage, to generate a variable current that is related to the selectable data rate, wherein said variable bias current generator generates a different variable current for each pipeline stage;
      and a reference current generator, coupled to the constant bias current generator and the variable bias current generator, for generating a reference current.

25. The converter of claim 24, wherein the programmable variable is dependent upon a program speed variable.

26. An analog to digital converter, comprising:
   an input unit to receive a variable analog input signal and to produce a constant analog signal, the input unit including a sampler to sample the variable analog input signal to produce the constant analog signal;
   a first pipeline stage to receive the constant analog signal and to produce a first digital output number and a first analog remainder signal;
   a summing unit to sum the first and second digital output numbers to generate a digital output signal; and
   a bias current generation unit, comprising:
      a constant bias current generator, separately coupled to said input unit and each pipeline stage, to generate a constant current;
      a variable bias current generator, separately coupled to said input unit and each pipeline stage, to generate a variable current that is related to the selectable data rate, wherein said variable current is proportional to a programmable variable;
      and a reference current generator, coupled to the constant bias current generator and the variable bias current generator, for generating a reference current.

27. The converter of claim 26, wherein the programmable variable is dependent upon a program speed variable.

28. A method for converting an analog input signal into a digital output signal, said method operating at a selectable data rate, comprising:
   setting a speed variable to provide a constant current and a variable current;
   choosing said speed variable to optimize power consumption;
   sampling a variable analog signal level;
   producing a first digital output number and a first analog remainder signal related to the sampled variable analog signal level;
   providing the first analog remainder signal to produce a second digital output number and a second analog remainder, wherein said first digital output number is delayed compared to said second digital output number;
   summing said first and second digital output numbers to generate said digital output signal; and
   changing the speed variable to produce the first digital output number and the second digital output number at the selectable data rate.

29. The method of claim 28, comprising using a reference current to generate said constant current and said variable current.

30. The method of claim 29, comprising delaying the first digital output number by one half of a clock period compared to said second digital output number.

31. The method of claim 29, comprising resetting a converter and presetting a mode.

32. The method of claim 29, wherein choosing said speed variable involves maximizing the figure of merit for an analog to digital converter.

* * * * *